United States Patent
Khan et al.

(10) Patent No.: US 7,405,145 B2
(45) Date of Patent: Jul. 29, 2008

(54) BALL GRID ARRAY PACKAGE SUBSTRATES WITH A MODIFIED CENTRAL OPENING AND METHOD FOR MAKING THE SAME

(75) Inventors: Reza-ur Rahman Khan, Rancho Santa Margarita, CA (US); Chong Hua Zhong, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 199 days.

(21) Appl. No.: 11/047,755

(22) Filed: Feb. 2, 2005

(65) Prior Publication Data
US 2005/0127501 A1  Jun. 16, 2005

Related U.S. Application Data

(62) Division of application No. 10/020,207, filed on Dec. 18, 2001, now Pat. No. 6,879,039.

(51) Int. Cl.
*H01L 23/48* (2006.01)
(52) U.S. Cl. .................... 438/613; 438/108
(58) Field of Classification Search .......... 257/678, 257/778, 737, 738; 438/108, 613
See application file for complete search history.

(56) References Cited

U.S. PATENT DOCUMENTS

| | | | |
|---|---|---|---|
| 3,790,866 A | | 2/1974 | Meyer et al. |
| 4,611,238 A | | 9/1986 | Lewis et al. |
| 5,006,143 A | * | 4/1991 | Kawase et al. ............... 65/43 |
| 5,026,303 A | * | 6/1991 | Matsuoka et al. ........... 439/526 |
| 5,045,921 A | | 9/1991 | Lin et al. |
| 5,065,281 A | | 11/1991 | Hernandez et al. |
| 5,173,766 A | | 12/1992 | Long et al. |
| 5,208,504 A | | 5/1993 | Parker et al. |

(Continued)

FOREIGN PATENT DOCUMENTS

EP   0 573 297 A2   12/1993

(Continued)

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging, IEEE* Aug. 1995, vol. 18, No. 3, pp. 491-495.

(Continued)

*Primary Examiner*—Roy K Potter
(74) *Attorney, Agent, or Firm*—Sterne, Kessler, Goldstein & Fox PLLC

(57) ABSTRACT

An electrically and mechanically enhanced die-down tape substrate ball grid array (BGA) package substrate is described. An IC package includes a substrate that has a first surface. The first surface has a central opening. A stiffener/heat spreader has a first surface. The first surface of the stiffener has a central ground ring. The first surface of the stiffener is coupled to a second surface of the substrate. The central opening has an edge. The edge includes at least one of the following: (a) a protruding edge portion that extends across at least a portion of the central ground ring, (b) a recessed edge portion that exposes a portion of the central ground ring, or (c) a hole proximate to the edge, wherein the hole exposes a portion of the central ground ring.

20 Claims, 8 Drawing Sheets

U.S. PATENT DOCUMENTS

| | | | |
|---|---|---|---|
| 5,216,278 A | 6/1993 | Lin et al. | |
| 5,285,352 A | 2/1994 | Pastore et al. | |
| 5,291,062 A | 3/1994 | Higgins, III | |
| 5,294,826 A | 3/1994 | Marcantonio et al. | |
| 5,366,589 A | 11/1994 | Chang | |
| 5,394,009 A | 2/1995 | Loo | |
| 5,397,917 A | 3/1995 | Ommen et al. | |
| 5,397,921 A | 3/1995 | Karnezos | |
| 5,409,865 A | 4/1995 | Karnezos | |
| 5,433,631 A | 7/1995 | Beaman et al. | |
| 5,438,216 A | 8/1995 | Juskey et al. | |
| 5,474,957 A | 12/1995 | Urushima | |
| 5,490,324 A | 2/1996 | Newman | |
| 5,534,467 A | 7/1996 | Rostoker | |
| 5,541,450 A | 7/1996 | Jones et al. | |
| 5,552,635 A | 9/1996 | Kim et al. | |
| 5,572,405 A | 11/1996 | Wilson et al. | |
| 5,578,869 A | 11/1996 | Hoffman et al. | |
| 5,583,377 A | 12/1996 | Higgins, III | |
| 5,583,378 A | 12/1996 | Marrs et al. | |
| 5,594,626 A * | 1/1997 | Rostoker et al. | 361/784 |
| 5,627,408 A | 5/1997 | Kusumi et al. | |
| 5,642,261 A | 6/1997 | Bond et al. | |
| 5,648,679 A | 7/1997 | Chillara et al. | |
| 5,650,659 A | 7/1997 | Mostafazadeh et al. | |
| 5,650,662 A | 7/1997 | Edwards et al. | |
| 5,691,567 A | 11/1997 | Lo et al. | |
| 5,701,033 A | 12/1997 | Ueda et al. | |
| 5,717,252 A | 2/1998 | Nakashima et al. | |
| 5,736,785 A | 4/1998 | Chiang et al. | |
| 5,744,863 A | 4/1998 | Culnane et al. | |
| 5,796,170 A | 8/1998 | Marcantonio | |
| 5,798,909 A | 8/1998 | Bhatt et al. | |
| 5,801,432 A | 9/1998 | Rostoker et al. | |
| 5,825,084 A | 10/1998 | Lau et al. | |
| 5,835,355 A | 11/1998 | Dordi | |
| 5,843,808 A | 12/1998 | Karnezos | |
| 5,844,168 A | 12/1998 | Schueller et al. | |
| 5,856,911 A | 1/1999 | Riley | |
| 5,866,949 A | 2/1999 | Schueller | |
| 5,883,430 A | 3/1999 | Johnson | |
| 5,889,321 A | 3/1999 | Culnane et al. | |
| 5,889,324 A | 3/1999 | Suzuki | |
| 5,894,410 A | 4/1999 | Barrow | |
| 5,895,967 A | 4/1999 | Stearns et al. | |
| 5,901,041 A | 5/1999 | Davies et al. | |
| 5,903,052 A | 5/1999 | Chen et al. | |
| 5,905,633 A | 5/1999 | Shim et al. | |
| 5,907,189 A | 5/1999 | Mertol | |
| 5,907,903 A | 6/1999 | Ameen et al. | |
| 5,920,117 A | 7/1999 | Sono et al. | |
| 5,949,137 A | 9/1999 | Domadia et al. | |
| 5,953,589 A | 9/1999 | Shim et al. | |
| 5,972,734 A | 10/1999 | Carichner et al. | |
| 5,976,912 A | 11/1999 | Fukutomi et al. | |
| 5,977,626 A | 11/1999 | Wang et al. | |
| 5,977,633 A | 11/1999 | Suzuki et al. | |
| 5,982,621 A | 11/1999 | Li | |
| 5,986,340 A | 11/1999 | Mostafazadeh et al. | |
| 5,986,885 A | 11/1999 | Wyland | |
| 5,998,241 A | 12/1999 | Niwa | |
| 5,999,415 A | 12/1999 | Hamzehdoost | |
| 6,002,147 A | 12/1999 | Iovdalsky et al. | |
| 6,002,169 A | 12/1999 | Chia et al. | |
| 6,011,304 A | 1/2000 | Mertol | |
| 6,011,694 A | 1/2000 | Hirakawa | |
| 6,020,637 A | 2/2000 | Karnezos | |
| 6,028,358 A | 2/2000 | Suzuki | |
| 6,034,427 A | 3/2000 | Lan et al. | |
| 6,040,984 A | 3/2000 | Hirakawa | |
| 6,057,601 A | 5/2000 | Lau et al. | |
| 6,060,777 A | 5/2000 | Jamieson et al. | |
| 6,069,407 A | 5/2000 | Hamzehdoost | |
| 6,077,724 A | 6/2000 | Chen | |
| 6,084,297 A | 7/2000 | Brooks et al. | |
| 6,084,777 A | 7/2000 | Kalidas et al. | |
| 6,114,761 A | 9/2000 | Mertol et al. | |
| 6,117,797 A | 9/2000 | Hembree | |
| 6,122,171 A | 9/2000 | Akram et al. | |
| 6,133,064 A | 10/2000 | Nagarajan et al. | |
| 6,140,707 A | 10/2000 | Plepys et al. | |
| 6,160,705 A | 12/2000 | Stearns et al. | |
| 6,162,659 A | 12/2000 | Wu | |
| 6,163,458 A | 12/2000 | Li | |
| 6,166,434 A | 12/2000 | Desai et al. | |
| 6,184,580 B1 | 2/2001 | Lin | |
| 6,201,300 B1 | 3/2001 | Tseng et al. | |
| 6,207,467 B1 | 3/2001 | Vaiyapuri et al. | |
| 6,212,070 B1 | 4/2001 | Atwood et al. | |
| 6,242,279 B1 | 6/2001 | Ho et al. | |
| 6,246,111 B1 | 6/2001 | Huang et al. | |
| 6,278,613 B1 | 8/2001 | Fernandez et al. | |
| 6,288,444 B1 | 9/2001 | Abe et al. | |
| 6,313,521 B1 | 11/2001 | Baba | |
| 6,313,525 B1 | 11/2001 | Sasano | |
| 6,347,037 B2 | 2/2002 | Iijima et al. | |
| 6,362,525 B1 | 3/2002 | Rahim | |
| 6,369,455 B1 | 4/2002 | Ho et al. | |
| 6,380,623 B1 | 4/2002 | Demore | |
| 6,462,274 B1 | 10/2002 | Shim et al. | |
| 6,472,741 B1 | 10/2002 | Chen et al. | |
| 6,525,942 B2 | 2/2003 | Huang et al. | |
| 6,528,869 B1 | 3/2003 | Glenn et al. | |
| 6,528,892 B2 | 3/2003 | Caletka et al. | |
| 6,541,832 B2 | 4/2003 | Coyle | |
| 6,545,351 B1 | 4/2003 | Jamieson et al. | |
| 6,552,266 B2 | 4/2003 | Carden et al. | |
| 6,552,428 B1 | 4/2003 | Huang et al. | |
| 6,552,430 B1 | 4/2003 | Perez et al. | |
| 6,563,712 B2 | 5/2003 | Akram et al. | |
| 6,583,516 B2 | 6/2003 | Hashimoto | |
| 6,602,732 B2 | 8/2003 | Chen | |
| 6,614,660 B1 | 9/2003 | Bai et al. | |
| 6,617,193 B1 | 9/2003 | Toshio et al. | |
| 6,657,870 B1 | 12/2003 | Ali et al. | |
| 6,664,617 B2 | 12/2003 | Siu | |
| 6,724,071 B2 | 4/2004 | Combs et al. | |
| 6,724,080 B1 | 4/2004 | Ooi et al. | |
| 2001/0001505 A1 | 5/2001 | Schueller et al. | |
| 2001/0020535 A1 | 9/2001 | Takahashi et al. | |
| 2001/0040279 A1 | 11/2001 | Mess et al. | |
| 2001/0045644 A1 | 11/2001 | Huang | |
| 2002/0053731 A1 | 5/2002 | Chao et al. | |
| 2002/0072214 A1 | 6/2002 | Yuzawa et al. | |
| 2002/0079562 A1 | 6/2002 | Zhao et al. | |
| 2002/0079572 A1 | 6/2002 | Khan et al. | |
| 2002/0096767 A1 | 7/2002 | Cote et al. | |
| 2002/0098617 A1 | 7/2002 | Lee et al. | |
| 2002/0109226 A1 | 8/2002 | Khan et al. | |
| 2002/0135065 A1 | 9/2002 | Zhao et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2002/0185720 A1 | 12/2002 | Khan et al. | |
| 2002/0185722 A1 | 12/2002 | Zhao et al. | |
| 2002/0185734 A1 | 12/2002 | Zhao et al. | |
| 2002/0185750 A1 | 12/2002 | Khan et al. | |
| 2002/0190361 A1 | 12/2002 | Zhao et al. | |
| 2002/0190362 A1 | 12/2002 | Khan et al. | |
| 2003/0057550 A1 | 3/2003 | Zhao et al. | |
| 2003/0111726 A1 | 6/2003 | Khan et al. | |
| 2003/0138613 A1 | 7/2003 | Thoman et al. | |
| 2003/0146503 A1 | 8/2003 | Khan et al. | |
| 2003/0146506 A1 | 8/2003 | Khan et al. | |

| | | | |
|---|---|---|---|
| 2003/0146509 | A1 | 8/2003 | Zhao et al. |
| 2003/0146511 | A1 | 8/2003 | Zhao et al. |
| 2003/0179549 | A1 | 9/2003 | Zhong et al. |
| 2003/0179556 | A1 | 9/2003 | Zhao et al. |
| 2004/0072456 | A1 | 4/2004 | Dozier II, et al. |
| 2004/0212051 | A1 | 10/2004 | Zhao et al. |

FOREIGN PATENT DOCUMENTS

| | | |
|---|---|---|
| EP | 0 645 811 A2 | 3/1995 |
| EP | 0 504 411 B1 | 6/1998 |
| EP | 0 932 328 A1 | 7/1999 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |

OTHER PUBLICATIONS

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Bail Grid Array Technology," *Ball Grid Array Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection on High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No.4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effecdt of Internal Package Delamination on the Thermal Performance of PQFP, Thermally Enhanced PQFP, LOC and BGA Packages", *45th Electonic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translate of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Developmental of a Tab (TCP) Ball Grid Array Package", *Proceedings of the 1995 International Electronics Packaging Conference*, San Diego, CA, Sep. 24-27, 1995, pp. 558-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of the Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Paid Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technical for Ball Grid Array Packaging", *Surface Mount International Conference Proceedings*, Surfaces Mount International, Aug. 29-Sep. 2, 1993, San Jose, California, pp.81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques for Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue To Evolve", *Electronic Design*, Feb. 6, 1995, pp. 141-146.

"How To Give Your BGAs A Better Botton Line,", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West'95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Karnezos, M., "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transaction on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publication Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI LOGIC Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.W. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New *Super*BGA® Package", *1995 International Electronics Packaging Conference*, San Diego, California, Sep. 24-27, 1995, pp. 565-576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Packaged", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advance Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production(Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, K. and Viswanadham, P., "Organic Carrier Requirement for Flip Chip Assemblies", *Journal of Surface Mount Technology*, Surface Mount Technology Association, Jul. 1994, pp. 15-20.

Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Attach Using Digital Tomosynthesis", *Surface Mount International Proceedings of The Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Schmolze, C. and Fraser, A., "SPICE Modeling Helps Enhance BGA Performance", *Electronic Packaging& Production*, Jan. 1995, pp. 50-52.

Schueller, R.D. et al., "Performance and Reliability of a Cavity Down Tape BGA Package,", *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technologu Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorial and Short Courses", *45th Electronic Compenents& Technology Conference*, May 21-24, 1995, Las Vegas, Nevada, IEEE, 4 pages.

Vardaman, E. J. and Crowley, R.T., "Worldwide Trends In Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West'95*, Reed Exhibition Companies, Feb. 26-Mar. 2, 1995, Anaheim, California, pp. 1530-1541.

Zamborsky, E., "BGAs in the Assembly Process", *Circuit Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Production", *Electronic Packaging & Production*, (*Special Supplement*), Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Amkor package data sheet, "SuperFC$^{200}$ ", from http://www.amkor.com/Product/all_datasheets/superfc.pdf 2 pages ( Jan. 2003).

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al., "Flip-Chip Die Attach Technology,", Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging And Interconnection Handbook*, Third Edition, pp. 7.58-7.59, ISBN No. 0-07-134745-3, McGraw-Hill Companies (2000).

Lin, S. and Chang, N., "Challenges in Power-Group Integrity," *Proceedings Of The 2001 International Conference On Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal Of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).

European Search Report for Application Number 02258741.4-2203, dated Mar. 2, 2006.

* cited by examiner

BALL GRID ARRAY PACKAGE SUBSTRATES WITH A MODIFIED CENTRAL OPENING AND METHOD FOR MAKING THE SAME

CROSS-REFERENCE TO RELATED APPLICATION(S)

This application is a divisional of U.S. patent application Ser. No. 10/020,207, filed Dec. 18, 2001, which is incorporated herein by reference in its entirety.

BACKGROUND OF THE INVENTION

1. Field of the Invention

The invention relates generally to the field of integrated circuit (IC) device packages, and more particularly to improved substrate designs in ball grid array (BGA) packages.

2. Related Art

Integrated circuit (IC) dies are typically mounted in or on a package that is configured to be attached to a printed circuit board (PCB). One such type of IC die package is a ball grid array (BGA) package. BGA packages are useful for a number of reasons, including high reliability, and good thermal and electrical characteristics. BGA packages also provide for smaller footprints than many other available package solutions.

A BGA package has an array of solder balls located on a bottom external surface of a package substrate. The solder balls are reflowed to attach the package to the PCB. In a "die-up" BGA package, the IC die is mounted to a top surface of the package substrate. In a die-down BGA package, the IC die is mounted to the bottom surface of the package substrate. Bond wires typically couple signals in the IC die to the substrate. The substrate has internal routing which electrically couples the bond wires to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. The stiffener also provides for greater spreading of heat from the IC die. In a die-up configuration, openings in the stiffener may be used to allow the IC die to be bond-wired to the substrate.

In one type of die-down tape-substrate BGA package design, the tape substrate has a rectangular central opening. The substrate is mounted to the bottom surface of a stiffener. The bottom surface of the stiffener has a central cavity that coincides with the rectangular central opening of the substrate. The IC die is mounted to the stiffener, and resides in the cavity formed by the rectangular central opening and the stiffener cavity. A ground ring may surround the IC die in the BGA package. This package configuration suffers from long bond wires that are required to couple the IC die to the substrate. Bond wires coupled to the IC die must cross a portion of the cavity, and the ground ring, to reach signal bond fingers on the substrate.

In high-speed BGA designs, such long bond wires are undesirable. High-speed circuits require short signal lengths with low inductance to operate properly, or to operate at all. Hence, what is needed are BGA packages that provide for short bond wires lengths.

SUMMARY OF THE INVENTION

The present invention is directed at ball grid array (BGA) substrates having enhanced electrical and mechanical characteristics. In one aspect, the substrate has a first surface that has a central opening. The central opening has an edge. The edge includes at least one protruding edge portion that extends into the central opening. The substrate is capable of being coupled to a surface of a stiffener/heat spreader that has a central ground ring. The one or more protruding edge portions are configured to extend across the central ground ring when the substrate is coupled to the stiffener surface.

In another aspect, the substrate has a first surface that has a central opening. The central opening has an edge. The edge includes at least one recessed edge portion. The substrate is capable of being coupled to a surface of a stiffener/heat spreader that has a central ground ring. The one or more recessed edge portions are configured to expose a portion of the central ground ring when the substrate is coupled to the stiffener spreader surface.

In another aspect, the substrate has a first surface that has a central opening. The central opening has an edge. The first surface includes at least one hole proximate to the edge. The substrate is capable of being coupled to a surface of a stiffener/heat spreader that has a central ground ring. The one or more holes are configured to expose a portion of the central ground ring when the substrate is coupled to the stiffener surface.

In another aspect, the substrate has a surface that has a central opening. The central opening has an edge. At least one trace is located on the surface proximate to the edge. The substrate is capable of being coupled to a surface of a stiffener/heat spreader that has a central ground ring. The edge is configured to cover a corresponding portion of the central ground ring when the substrate is coupled to the stiffener surface.

In still another aspect, the present invention is directed to integrated circuit (IC) packages. An IC package includes a substrate that has a first surface. The first surface has a central opening. A stiffener/heat spreader has a first surface. The first surface of the stiffener has a central ground ring. The first surface of the heat spreader is attached to a second surface of the substrate. The central opening has an edge. The edge includes at least one of the following: (a) an edge portion that extends across at least a portion of the central ground ring, (b) a recessed edge portion that exposes a portion of the central ground ring, and (c) a hole proximate to the edge that exposes a portion of the central ground ring.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
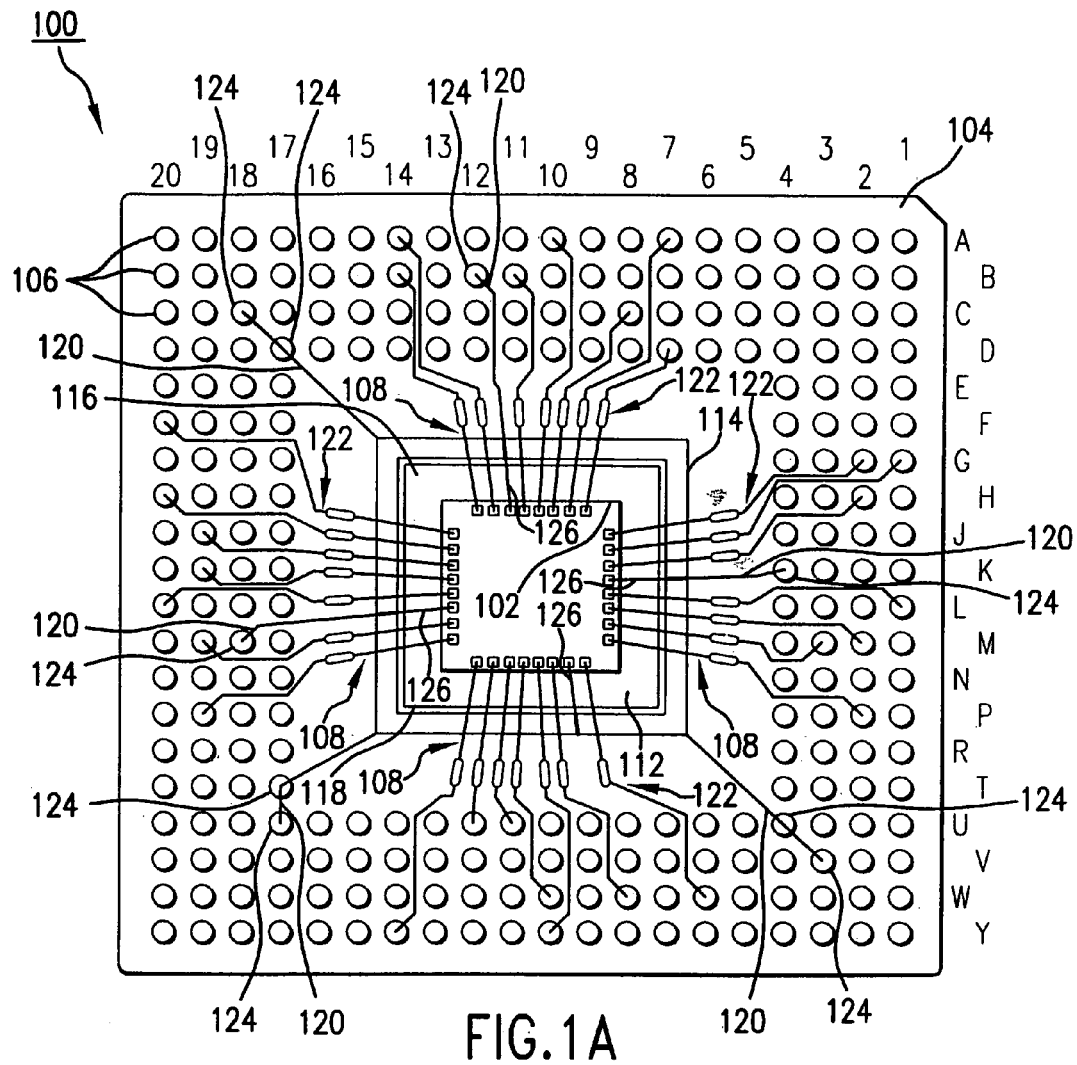
FIG. 1A illustrates a bottom view of a die-down BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Overview

The present invention is directed to a method and system for improving the mechanical, thermal, and electrical performances of a BGA package through improved substrate configurations. The present invention is applicable to all types of BGA substrates, including ceramic, plastic, and tape (flex) BGA packages. Furthermore the present invention is applicable to die-up (cavity-up) and die-down (cavity-down) orientations.

Numerous embodiments of the present invention are presented herein. In embodiments, the substrate in the BGA package is altered in one or more of several ways: (a) one or more edge portions of the central opening are extended into the central opening to cover portions of a stiffener ground ring; (b) one or more edge portions of the central opening may be recessed to expose portions of the stiffener ground ring; and (c) one or more holes may be formed in the substrate adjacent to or proximate to the central opening to expose portions of the stiffener ground ring.

In each embodiment, BGA package mechanical and electrical performance are improved. The embodiments of the present invention presented herein allow for larger package cavity sizes. In turn, the larger cavity sizes allow for larger sized IC dies with higher input and output (I/O) counts to be packaged in the same size package. The modifications to the substrate allow for relatively shorter bond wire lengths. As a result, improved power/ground connections can be made, and higher speed signals may be used. Various package inductances are reduced by the shorter bond wire lengths. By moving the substrate closer to the IC die, the substrate surface is effectively enlarged, and hence additional solder balls may be added to the bottom substrate surface. Furthermore, higher numbers of signal bond fingers/traces may be used. Additional advantages may also be realized.

Ball grid array package types are described below. Following the description of these package types, further description of the present invention is provided. The above-mentioned embodiments and further embodiments are described in greater detail. The embodiments described herein may be combined in any applicable manner, as required by a particular application.

Ball Grid Array (BGA) Packages

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but partially or entirely cover the bottom package surface in an array configuration. BGA packages are also referred to as pad array carrier (PAC), pad array, land grid array, and pad-grid array packages. BGA package types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

Figure 1B:
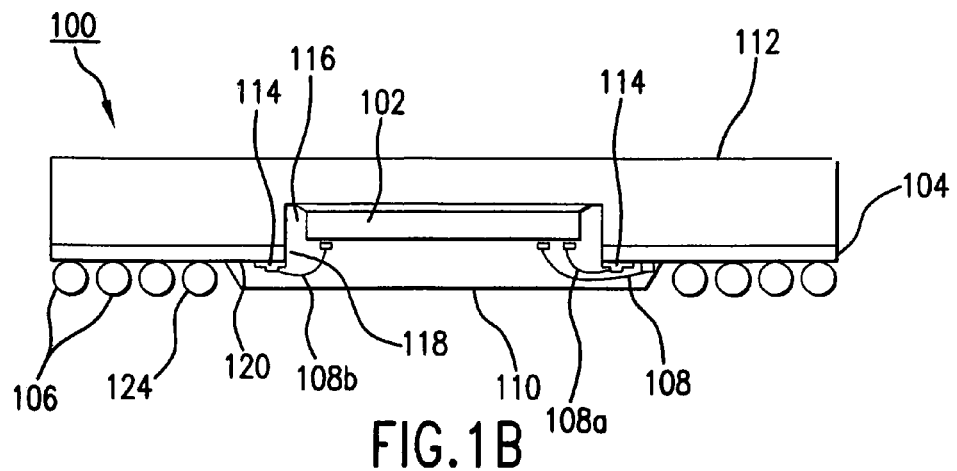
FIG. 1B illustrates a cross-sectional view of the die-down BGA package of FIG. 1A.

A number of BGA package substrate types exist, including ceramic, plastic (PBGA), and tape (also known as "flex") (TBGA). Tape or flex BGA packages are particularly appropriate for large IC dies with large numbers of input and outputs, such as application specific integrated circuits (ASIC) and microprocessors. FIG. 1A illustrates a bottom view of a die-down flex BGA package 100. FIG. 1B illustrates a cross-sectional view of die-down flex BGA package 100. Flex BGA package 100 includes an IC die 102, a tape substrate 104, a plurality of solder balls 106, one or more bond wires 108, and a stiffener 112.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement. In a plastic substrate embodiment, the plastic substrate may include one or more metal layers formed on an organic substrate (for example, BT resin or FR4 epoxy/glass). Substrate 104 has a rectangular central opening 118 to accommodate IC die 102 and bond wires 108.

Stiffener 112 is attached to the substrate to add planarity and rigidity to the package. Stiffener 112 may be laminated to substrate 104. Stiffener 112 is typically made from a metal, or combination of metals, such as copper, tin, and aluminum. Alternatively, stiffener 112 may be made from a polymer. Stiffener 112 also may act as a heat sink, and allow for greater heat spreading in BGA package 100. Hence, stiffener 112 may also be referred to as a heat spreader. As shown in FIGS. 1A and 1B, stiffener 112 may have a central cavity 116 in its bottom surface. The outer edges of central cavity 116 substantially coincide with central opening 118 in substrate 104 when stiffener 112 is attached to substrate 104. In alternative embodiments, the bottom surface of stiffener 112 does not include a central cavity 116, and is instead substantially flat.

Substrate 104 has a power or ground ring 114 plated on its bottom surface around central cavity 116. Ring 114 may be coupled to a ground or power voltage potential. For exemplary purposes, ring 114 is usually referred to herein as being coupled to a ground potential, and is therefore referred to herein as a "ground ring." However, it is intended to be understood that in alternative embodiments, ring 114 may serve as a power ring. Ring 114 is connected to one or more ground (or power) solder balls 124 by ground (or power) signal traces 120. Ground (or power) signal traces 120 are typically copper or other metal traces that are wider than regular signal traces. Ground (or power) solder balls 124 are coupled to PCB ground (or power) pads when BGA package 100 is mounted on a PCB. One or more ground (or power) bond wires 126 couple ground (or power) pins of IC die 102 to ring 114.

IC die 102 is attached to stiffener 112, and resides at least partially in central cavity 116. IC die 102 may be attached to stiffener 112 by an epoxy, for example. IC die 102 is any type of semiconductor integrated circuit. One or more bond wires 108 connect IC die 102 to substrate 104. Bond wires 108 and ground bond wires 126 may be gold, copper, or other types of conductors. For example, bond wires 108 connect signals pins on IC die 102 to one or more traces/bond fingers 122 on substrate 104. A bond finger is a portion of a trace that extends towards IC die 102 on substrate 104 such that a bond wire may be coupled to it. Bond wires 108 must be relatively long. Bond wires 108 that connect signals in IC die 102 to bond fingers 122 on substrate 104 must cross ground ring 114. Bond fingers 122 are typically formed from copper, other metal, or combination of metals.

An encapsulant 110 (shown in FIG. 1B), which may be an epoxy, mold compound, or other encapsulating material, covers IC die 102 and bond wires 108 for mechanical and environmental protection.

Figure 2A:
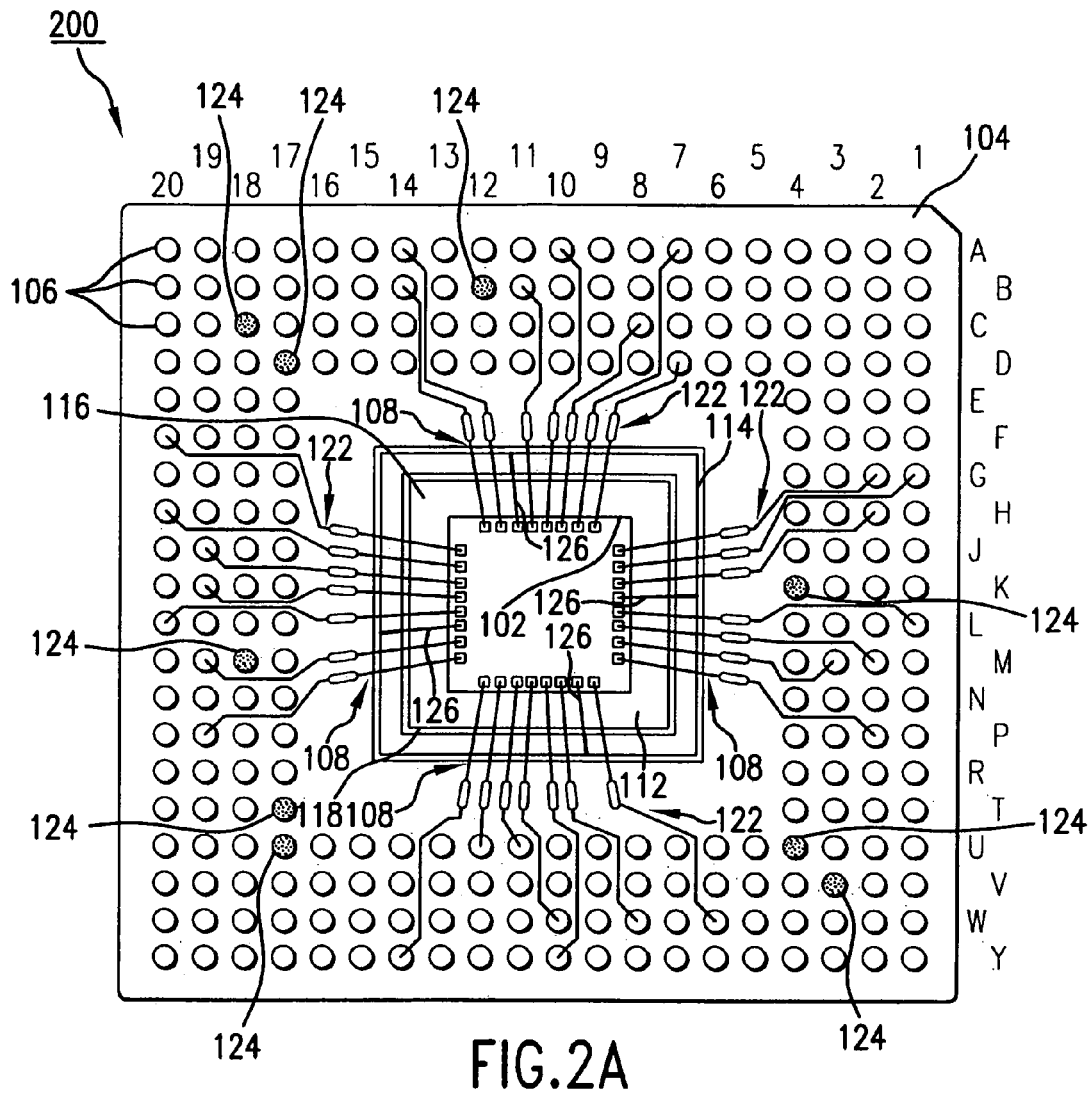
FIG. 2A illustrates a bottom view of an alternative die-down BGA package.

IC dies are being produced with progressively higher pin counts to accommodate more input and output signals, while the size of IC packages are becoming smaller. Because of these advances, the routing of signal and ground/power traces in and on the package substrate is becoming increasingly more challenging. Narrower traces may be used to increase the number of possible traces on a substrate. Narrower traces, however, have the disadvantage of increased inductance, which is detrimental to high-speed signals. FIG. 2A illustrates a bottom view of a die-down flex BGA package 200, which is similar to die-down flex BGA package 100. BGA package 200 is configured to overcome at least some of these above-described disadvantages. In BGA package 200, the package stiffener is configured to function as a ground or power plane. Ground (or power) solder balls are connected to the stiffener through the package substrate. In this manner, relatively shorter ground (or power) connections may be formed, and relatively fewer signal traces are required in the package substrate, as further described below.

Figure 2B:
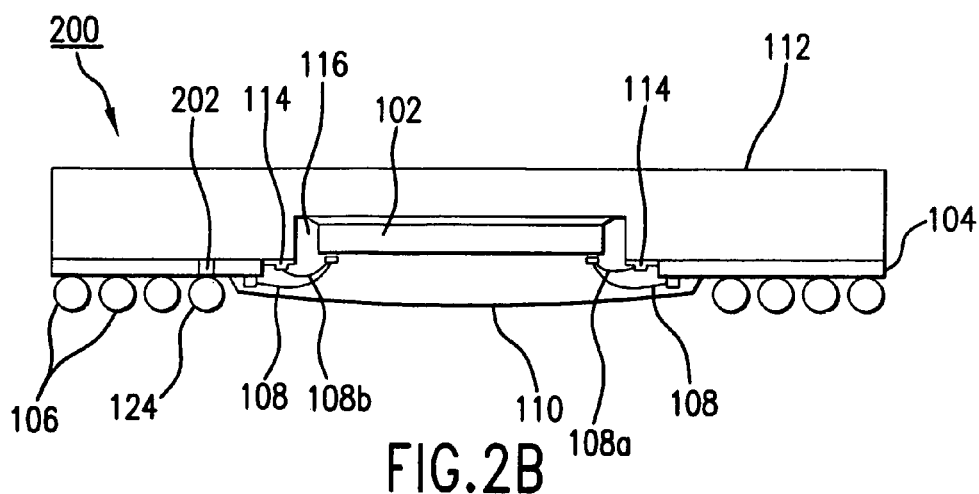
FIG. 2B illustrates a cross-sectional view of the die-down BGA package of FIG. 2A.

FIG. 2B illustrates a cross-sectional view of die-down flex BGA package 200. In BGA package 200, ground ring 114 is plated or otherwise formed on stiffener 112 around the outer edges of central cavity 116. The central opening 118 in substrate 104 is therefore larger in BGA package 200, to surround ground ring 114 instead of central cavity 116. BGA package 200 provides advantages in coupling signals in IC die 102 to PCB ground or power.

Because ground ring 114 is located on stiffener 112, ground signal traces 120 that are present in BGA package 100 are not required in BGA package 200. Ground signals in IC die 102 are coupled to ground solder balls 124 on the bottom surface of substrate 104 through a different path than in BGA package 100. Stiffener 112 acts as a ground plane for BGA package 200. Ground vias, such as ground via 202 shown in FIG. 2B, couple ground solder balls 124 to stiffener 112 through substrate 104. Because stiffener 112 in BGA package 200 is conductive, stiffener 112 couples ground solder balls 124 to ground ring 114. One or more ground bond wires 126 couple ground pins of IC die 102 to ground ring 114. In this manner, ground signals in IC die 102 that are coupled to the ground pins of IC die 102 are coupled to ground solder balls 124.

BGA package 200 provides for improved substrate routing over BGA package 100. Because ground signal traces 120 are not present in BGA package 200, there is more space for signal traces on substrate 104. Furthermore, with stiffener 112 acting as a ground plane, the inductance and impedance of ground signal traces 120 is not present. This leads to improved ground signal performance. However, in the configuration of BGA package 200, bond wires 108 from IC die 102 to points on substrate 104 still must be relatively long. Bond wires 108 that connect signals in IC die 102 to bond fingers 122 on substrate 104 still must cross over ground ring 114.

With the increase in signal frequencies of integrated circuits, such as in "gigibit" frequency devices, the design of 50 Ohm IC packages is becoming more critical. Signal path inductances can be calculated as a combination of the length and cross-sectional area of bond wires, the length and cross-sectional area of signal traces, and the size of solder balls. In BGA packages, the unit length inductance of bond wires is frequently greater than that of signal traces. Increasing the width of signal traces, and using a stiffener as a ground plane can provide performance improvements. Shortening the length of bond wires is also desirable to improve the performance of high-frequency IC packages. The present invention is directed to providing such improvements in high-frequency IC packages, as further described below.

The present invention is applicable to improving electrical and mechanical performance in the BGA package types described herein, and in other BGA package types. Further BGA package configurations are described in the following co-pending related applications, which are incorporated by reference in their entireties herein:

U.S. Ser. No. 09/742,366, titled "Enhanced Die-Up Ball Grid Array and Method for Making the Same," filed on Dec. 22, 2001.

U.S. Ser. No. (to be assigned), titled "Enhanced Die-up Ball Grid Array Packages and Method for Making the Same," filed on Oct. 29, 2001.

U.S. Ser. No. 09/783,034, titled "Enhanced Die-Down Ball Grid Array and Method for Making the Same," filed on Feb. 15, 2001.

U.S. Ser. No. 09/849,537, titled "Die-up Ball Grid Array Package With a Heat Spreader And Method For Making The Same," filed May 7, 2001.

The present invention is also applicable to integrated circuit package types other than BGA packages, as would be apparent to persons skilled in the relevant art(s) from the teachings herein.

SUBSTRATE EMBODIMENTS ACCORDING TO THE PRESENT INVENTION

Further details of structural and operational implementations of BGA packages of the present invention are described in the following sections. These structural and operational implementations are described herein for illustrative purposes, and are not limiting. For instance, the present invention as described herein may be implemented in both die-up and die-down BGA package types, as well as other IC package types. Furthermore, each of the embodiments presented below are applicable to tape substrate BGA packages, plastic substrate BGA packages, and ceramic substrate BGA packages. The description below is adaptable to these and other package types, as would be understood to persons skilled in the relevant art(s) from the teachings herein.

Features of each of the embodiments presented below and elsewhere herein may be incorporated into BGA packages independently, or may be combined in a BGA package in any manner, as would be apparent to persons skilled in the relevant art(s) from the teachings herein.

According to embodiments of the present invention, the mechanical and electrical performances of a BGA package are enhanced by altering the shape of the package substrate. The substrate of the present invention has a central opening. The central opening may be substantially circular, elliptical, rectangular, or any other polygon or shape. For exemplary purposes, the central opening is shown herein as substantially rectangular. A stiffener/heat spreader is attached to a top surface of the substrate. The stiffener/heat spreader has a central ground or power ring plated or otherwise formed on its bottom surface. The central opening in the substrate may be modified to expose and/or cover portions of the central ground ring on the stiffener/heat spreader to reduce bond wire lengths. In embodiments, the substrate central opening may be altered in several ways: (a) one or more edge portions of the central opening are extended into the central opening to cover portions of the ground ring; (b) one or more edge portions of the central opening may be recessed to expose portions of the ground ring; and (c) one or more holes may be formed in the substrate adjacent to or proximate to one or more edges of the central opening to expose portions of the ground ring. As described below, these modifications to the shape of the central opening allow for relatively shorter bond wire lengths.

The shape of the central opening in the substrate may be formed in any number of ways. The central opening and respective modifications described herein may be formed when the substrate is created or later. The central opening and respective modifications may be cut or punched out of a substrate. Furthermore, the central opening and respective modifications may be formed in other ways.

Figure 3:
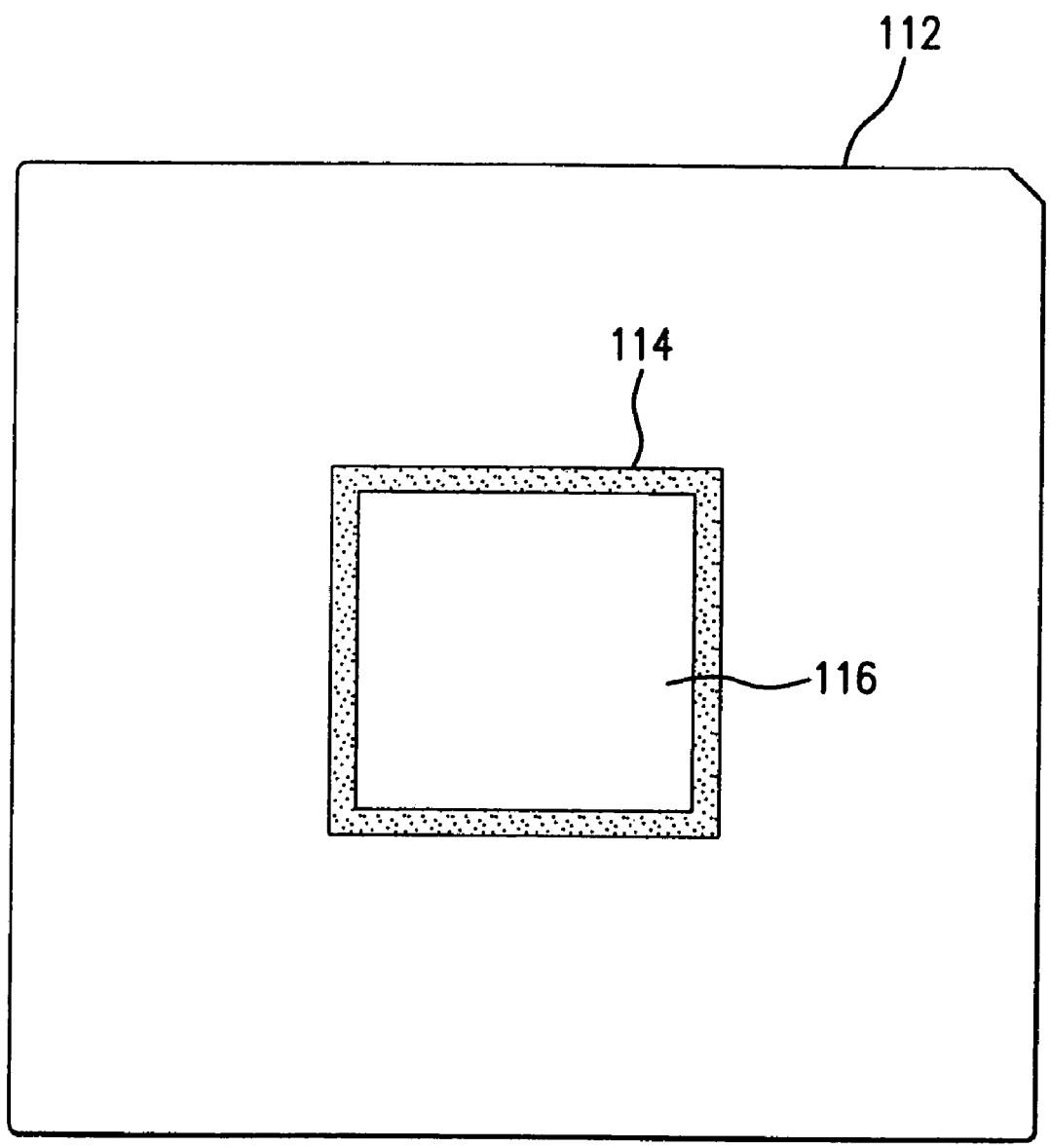
FIG. 3 illustrates a bottom view of a stiffener/heat spreader with a central ground ring.

FIG. 3 illustrates a bottom view of stiffener/heat spreader 112. Stiffener/heat spreader 112 has ground ring 114 plated or otherwise formed on the bottom surface. Cavity 116 is located centrally in stiffener 112, within ground ring 114. The material used for stiffener 112 may be one or more metals such as copper and aluminum, for example. Stiffener 112 may be machined, molded, or otherwise manufactured from these materials. Ground ring 114 may or may not be plated on stiffener 112. For example, ground ring 114 may be a silver or palladium plated ground ring on the surface of stiffener 112.

Figure 4:
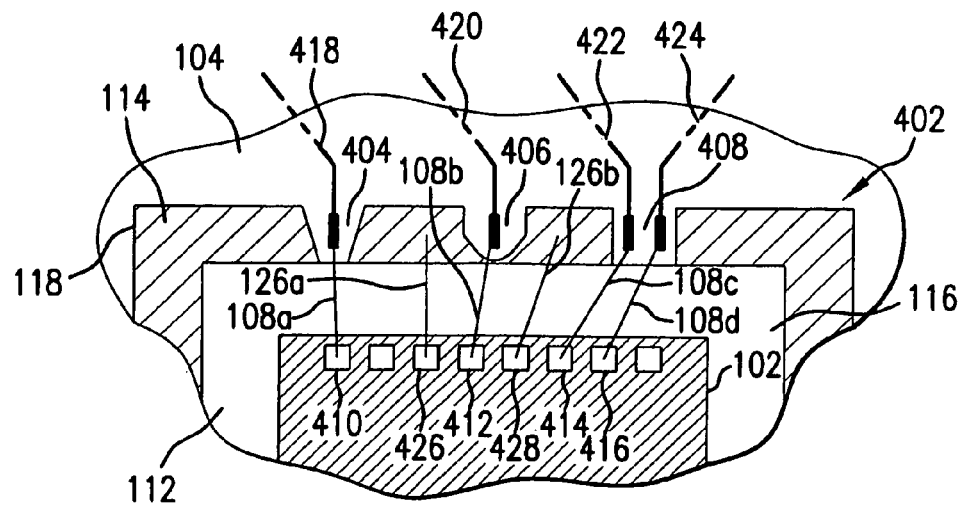
FIGS. 4-6 each illustrate an edge of a central opening in a substrate that is shaped according to exemplary embodiments of the present invention.

As described above, according to an embodiment of the present invention, portions of an edge of a central opening in a package substrate are extended over a ground ring, to allow for relatively shorter bond wires. FIG. 4 illustrates an edge 402 of a central opening 118 in substrate 104, that incorporates exemplary embodiments of the present invention. In FIG. 4, a portion of central opening 118, a portion of IC die 102, a portion of central cavity 116, and a portion of ground ring 114 are shown. Substrate 104 is attached to a stiffener such as stiffener 112 shown in FIG. 3. The side of ground ring 114 that is adjacent to edge 402 is exposed through central opening 118. In a conventional implementation, substantially all of ground ring 114 would be exposed through central opening 118. In the embodiment of the present invention shown in FIG. 4, portions of the side of ground ring 114 adjacent to edge 402 are covered by a first, a second, and a third protruding edge portion 404, 406, and 408 of edge 402. Because first, second, and third protruding edge portions 404, 406, and 408 protrude and extend across portions of ground ring 114, relatively shorter bond wires 108 may be used to couple pins of IC die 102 to bond fingers on substrate 104 than in a conventional implementation.

According to the present invention, edge portions of central opening 118 in substrate 104 extend at least partially across ground ring 114, and may be of any size and shape. They may extend partially or completely across ground ring 114, and may even extend at least partially over cavity 116. The edge portions may be wide enough to accommodate any number bond fingers, and attachment of any number of corresponding bond wires. Furthermore, they may be shaped in any variety of shapes. First, second, and third protruding edge portions 404, 406, and 408 are generally tab shaped. As shown in FIG. 4, first protruding edge portion 404 is substantially triangular or tapered in shape. Second protruding edge portion 406 is substantially curved in shape. Third protruding edge portion 408 is substantially rectangular in shape. The present invention is applicable to these shapes, and any others for these edge portions.

As shown in FIG. 4, a first bond wire 108a couples a first pin 410 on IC die 102 to a first bond finger 418 on first protruding edge portion 404. A second bond wire 108b couples second pin 412 on IC die 102 to a second bond finger 420 on second protruding edge portion 406. A third bond wire 108c couples a third pin 414 on IC die 102 to a third bond finger 422 on third protruding edge portion 408. A fourth bond wire 108d couples a fourth pin 416 on IC die 102 to a fourth bond finger 424 on third protruding edge portion 408. As shown in FIG. 4, single bond wires are coupled from IC die 102 to each of first and second edge portions 404 and 406, and two bond wires are coupled from IC die 102 to third protruding edge portion 408. The present invention is applicable to any number of bond wires being coupled to an edge portion.

Furthermore, one or more ground bond wires may couple pins on IC die 102 to ground ring 114 between and around the protruding edge portions. For example, as shown in FIG. 4, a first ground bond wire 126a couples a first ground pin 426 to ground ring 114 between first protruding edge portion 404 and second protruding edge portion 406. A second ground bond wire 126b couples a second ground pin 428 to ground ring 114 between second protruding edge portion 406 and third protruding edge portion 408. The invention is applicable to any number of ground bond wires being coupled from the IC die to the ground ring among the protruding edge portions.

Figure 5:
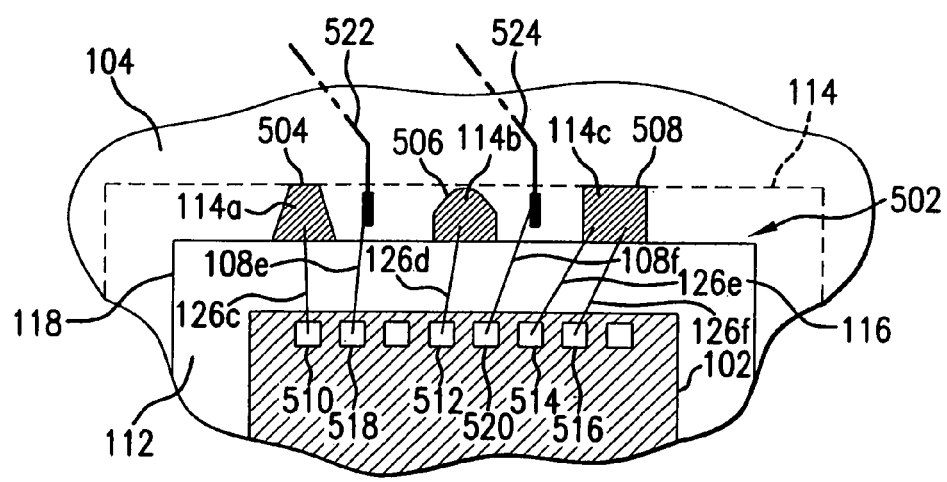

According to a further embodiment, portions of a substrate may be recessed to expose portions of a ground ring, to allow for relatively shorter bond wires. FIG. 5 illustrates an edge 502 of a central opening 118 in substrate 104, that incorporates exemplary embodiments of the present invention. A portion of central opening 118, a portion of IC die 102, a portion of substrate 104, and a portion of central cavity 116 are shown. Substrate 104 is attached to a stiffener such as stiffener 112 shown in FIG. 3. In the implementation of BGA package 200 shown in FIGS. 2A-2B, ground ring 114 on stiffener 112 is completely exposed through central opening 118. In the embodiment of the present invention shown in FIG. 5, substrate 104 substantially covers ground ring 114. However, portions of ground ring 114 are exposed by a first, a second, and a third recessed edge portion 504, 506, and 508 of edge 502. First edge portion 504 exposes a first ground ring portion 114a. Second edge portion 506 exposes a second ground ring portion 114b. Third edge portion 508 exposes a third ground ring portion 114c. Because first, second, and third edge portions 504, 506, and 508 expose portions of ground ring 114, ground bond wires 126 may couple pins of IC die 102 to ground ring 114. Furthermore, relatively shorter bond wires 108 may be used to couple pins of IC die 102 to bond fingers on substrate 104 than in a conventional implementation.

According to the present invention, edge portions of central opening 118 in substrate 104 are recessed to expose at least a portion of ground ring 114 from under substrate 104. The recessed edge portions may be of any size and shape. They may be recessed partially or completely across ground ring 114. The recessed edge portions may be wide enough to accommodate any number of ground bond wires. Furthermore, they may be shaped in any variety of shapes. As shown in FIG. 5, first recessed edge portion 504 is substantially triangular or tapered in shape. Second recessed edge portion 506 is substantially curved in shape. Third recessed edge portion 508 is substantially rectangular in shape. The present invention is applicable to any shape for these recessed edge portions.

As shown in FIG. 5, a third ground bond wire 126c couples a first pin 510 on IC die 102 to first ground ring portion 114a in first recessed edge portion 504. A fourth ground bond wire 126d couples a second pin 512 on IC die 102 to second ground ring portion 114b in second recessed edge portion 506. A fifth ground bond wire 126e couples a third pin 514 on IC die 102 to third ground ring portion 114c in third recessed edge portion 508. A sixth ground bond wire 126f couples a fourth pin 516 on IC die 102 to third ground ring portion 114c in third recessed edge portion 508. As shown in FIG. 5, single ground bond wires are coupled to ground ring 114 in each of first and second recessed edge portions 504 and 506, and two bond wires are coupled to ground ring 114 in third edge portion 508. The present invention is applicable to any number of ground bond wires being coupled to ground ring 114 in a recessed edge portion.

Furthermore, one or more signal bond wires may couple pins on IC die 102 to substrate 104 between and around the recessed edge portions. For example, as shown in FIG. 5, a fifth bond wire 108e couples a fifth pin 518 to a fifth bond finger 522 between first recessed edge portion 504 and second recessed edge portion 506. A sixth bond wire 108f couples a sixth pin 520 to a sixth bond finger 524 between second recessed edge portion 506 and third recessed edge portion 508. The invention is applicable to any number of signal bond wires coupled to bond fingers on substrate 104 among the recessed edge portions.

Figure 6:
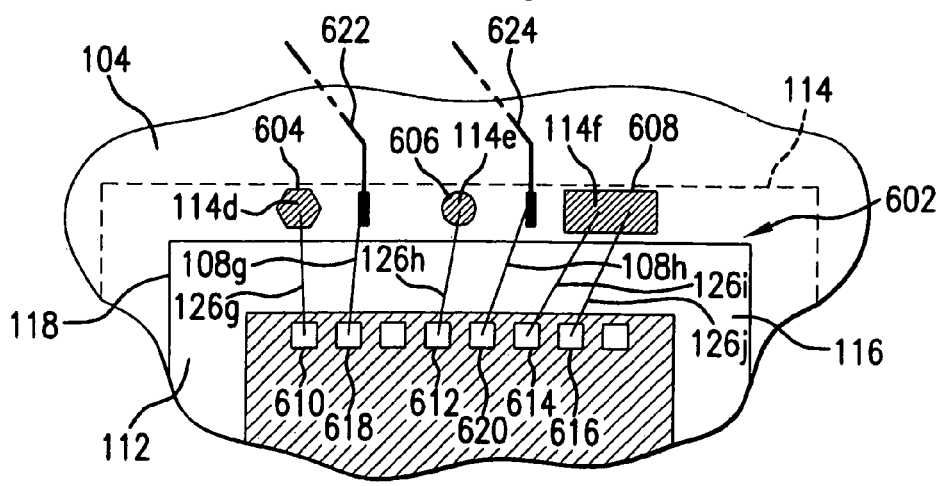

According to a further embodiment, portions of a substrate may be opened or "punched-through" to expose portions of a ground ring, to allow for relatively shorter bond wires. FIG. 6 illustrates an edge 602 of a central opening 118 in substrate 104, that incorporates exemplary embodiments of the present invention. A portion of central opening 118, a portion of IC die 102, a portion of substrate 104, and a portion of central cavity 116 are shown. Substrate 104 is attached to stiffener a stiffener such as stiffener 112 shown in FIG. 3. In the implementation of BGA package 200 shown in FIGS. 2A-2B, ground ring 114 on stiffener 112 is completely exposed through central opening 118. In the embodiment of the present invention shown in FIG. 6, portions of ground ring 114 are exposed by a first, a second, and a third substrate hole 604, 606, and 608 adjacent to, or proximate to edge 602. First substrate hole 604 exposes fourth ground ring portion 114d. Second substrate hole 606 exposes fifth ground ring portion 114e. Third substrate hole 608 exposes sixth ground ring portion 114f. Because first, second, and third substrate holes 604, 606, and 608 expose portions of ground ring 114, ground bond wires 126 may couple pins of IC die 102 to ground ring 114. Furthermore, relatively shorter bond wires 108 may be used to couple pins of IC die 102 to bond fingers on substrate 104 than in a conventional implementation.

According to the present invention, holes in the substrate are formed to expose at least a portion of ground ring 114 from under substrate 104. The substrate holes may be of any size and shape. They may be sized to partially or completely expose a width of ground ring 114. The substrate holes may be sized large enough to accommodate any number of ground bond wires. Furthermore, they may be shaped in any variety of shapes. As shown in FIG. 6, first substrate hole 604 is substantially hexagonal in shape. Second substrate hole 606 is substantially elliptical or circular in shape. Third substrate hole 608 is substantially rectangular in shape. The present invention is applicable to any polygon or other shape for these substrate holes.

As shown in FIG. 6, a seventh ground bond wire 126g couples a first pin 610 on IC die 102 to fourth ground ring potion 114d through first substrate hole 604. An eighth ground bond wire 126h couples a second pin 612 on IC die 102 to fifth ground ring portion 114e through second substrate hole 606. A ninth ground bond wire 126i couples a third pin 614 on IC die 102 to sixth ground ring portion 114f through third substrate hole 608. A tenth ground bond wire 126j couples a fourth pin 616 on IC die 102 to sixth ground ring portion 114f through third substrate hole 608. As shown in FIG. 6, single ground bond wires are coupled to ground ring 114 through each of first and second substrate holes 604 and 606, and two bond wires are coupled to ground ring 114 through third substrate hole 608. The present invention is applicable to any number of ground bond wires being coupled to ground ring 114 through a substrate hole.

Furthermore, one or more signal bond wires may couple pins on IC die 102 to substrate 104 between and around the substrate holes. For example, as shown in FIG. 6, a seventh bond wire 108g couples a fifth pin 618 to a seventh bond finger 622 between first substrate hole 604 and second substrate hole 606. An eighth bond wire 108h couples an sixth pin 620 to an eighth bond finger 624 between second substrate hole 606 and third substrate hole 608. The invention is applicable to any number of signal bond wires coupled to bond fingers on substrate 104 among the substrate holes.

Figure 7:
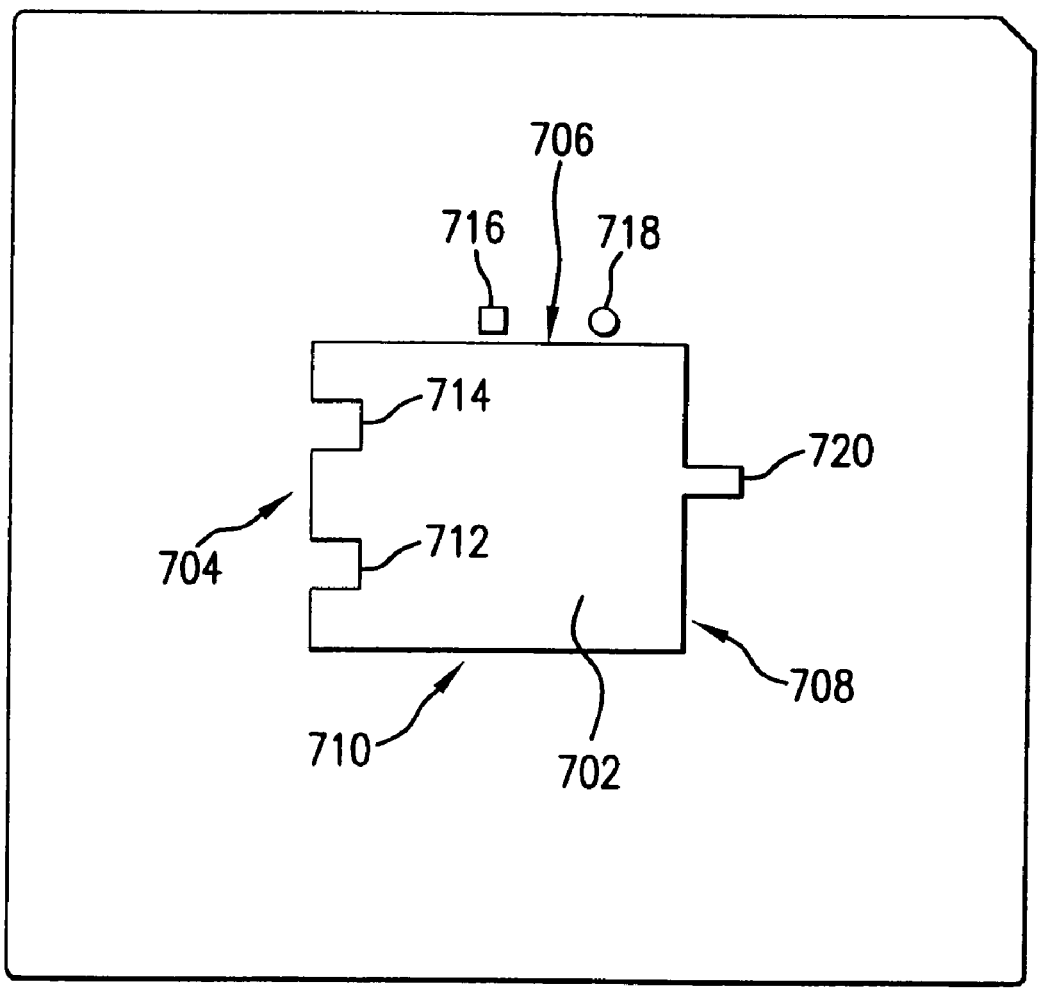
FIG. 7 illustrates a bottom view of a substrate with a central opening shaped according to an exemplary embodiment of the present invention.

One or more embodiments of the present invention provided herein may be combined in a single substrate customized for a particular application. FIG. 7 illustrates a bottom outline view of an exemplary customized substrate 700, according to an embodiment of the present invention. Surface features of customized substrate 700 are not shown in FIG. 7. Customized substrate 700 is configured to allow for shorter bond wires and improved ground/power ring operation, among other advantages. Substrate 700 is attached to a stiffener having a ground ring plated thereon or otherwise attached. For example, substrate 700 may be attached to stiffener 112. As shown in FIG. 3, stiffener 112 includes a ground ring 114.

As shown in FIG. 7, substrate 700 includes a substantially rectangular central opening 702 having a first edge 704, a second edge 706, a third edge 708, and a fourth edge 710. First edge 704, second edge 706, third edge 708, and fourth edge 710 are shaped according to embodiments of the present invention. In alternative embodiments, central opening 702 may be formed in shapes other than rectangular, including elliptical, circular, triangular, and other polygonal shapes, and therefore have more or less than four edges.

First edge 704 includes a first tab-shaped protruding substrate portion 712 and a second tab-shaped protruding substrate portion 714. Second edge 706 includes a rectangular substrate hole 716 proximate to second edge 706 and a round substrate hole 718 proximate to second edge 706. Third edge 708 includes a recessed substrate portion 720. Fourth edge 710 is a substantially straight edge. First, second, third, and fourth edges 704, 706, 708, and 710 are further described in relation to an exemplary BGA package as follows.

Figure 8A:
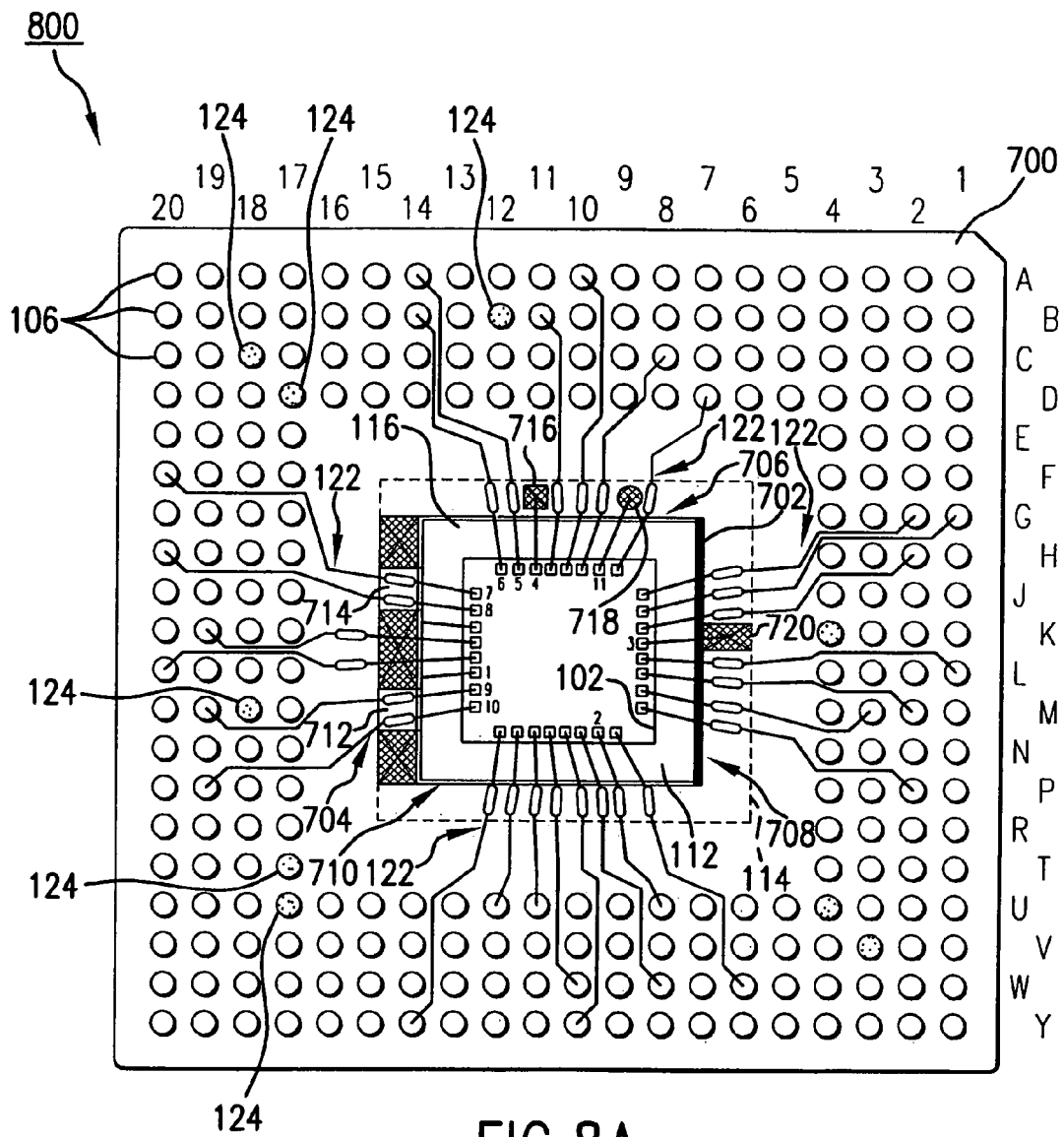
FIG. 8A illustrates a bottom view of the die-down BGA package incorporating the substrate of FIG. 7, according to an exemplary embodiment of the present invention.
Figure 8B:
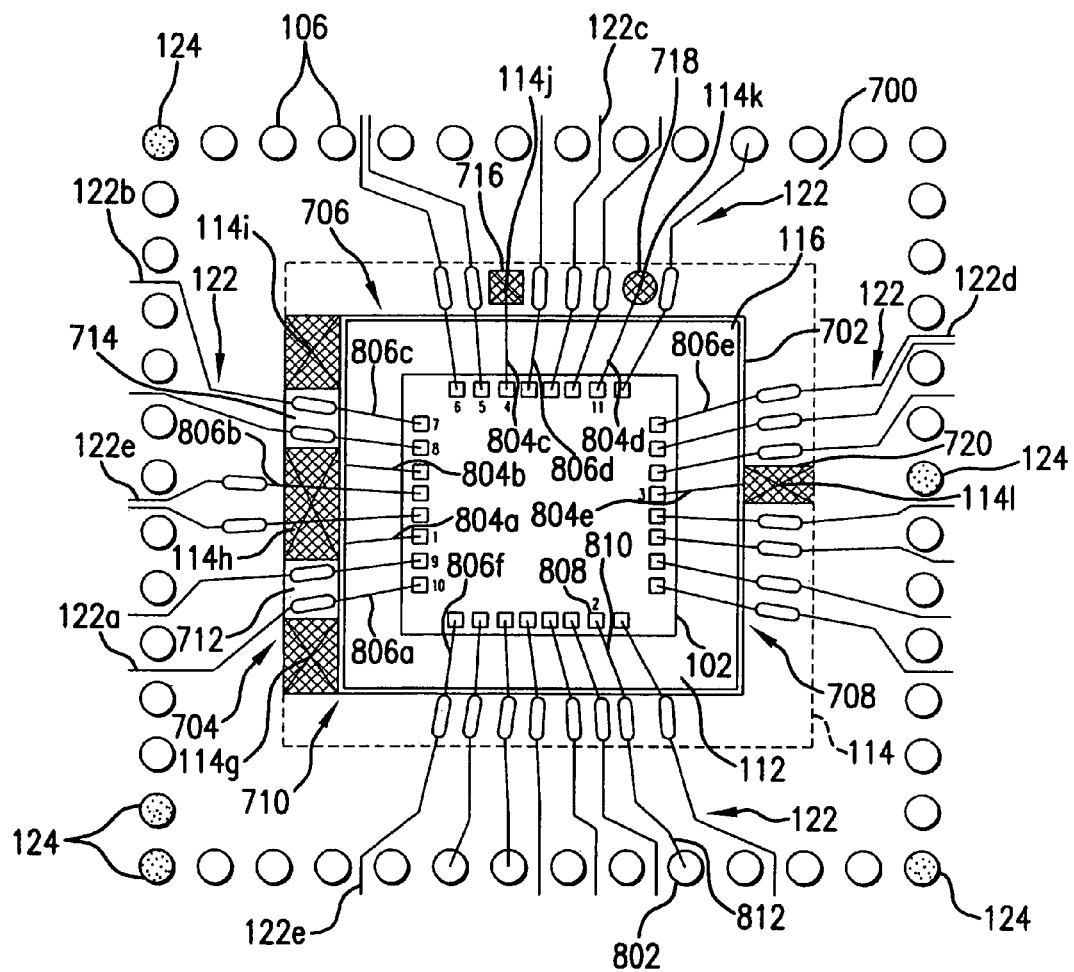
FIG. 8B illustrates a close-up view of a portion of the bottom of the die-down BGA package shown in FIG. 8A, according to an exemplary embodiment of the present invention.

FIG. 8A illustrates a bottom view of a die-down BGA package 800 that incorporates substrate 700, according to an exemplary embodiment of the present invention. BGA package 800 includes IC die 102, substrate 700, plurality of solder balls 106, stiffener 112, and one or more ground solder balls 124. Encapsulate 110 may be present, but is not shown in FIG. 8A. An outline of ground ring 114, which is largely covered by substrate 700, is shown. BGA package 800 is configured similarly to BGA packages 100 and 200 described above, subject to the description related to substrate 700 provided above. FIG. 8B illustrates an enlarged view of a portion of the bottom surface of BGA package 800, to provide enhanced detail.

As shown on first edge 704 of substrate 700 in FIG. 8B, first and second protruding substrate portions 712 and 714 extend over portions of ground ring 114 such that along first edge 704, only first, second, and third ground ring portions 114g, 114h, and 114i are exposed. A first ground bond wire 804a and a second ground bond wire 804b are coupled from ground pins on IC die 102 to second ground ring portion 114h. Because second ground ring portion 114h is adjacent to cavity 116, first and second ground bond wires 804a and 804b are relatively short. Furthermore, six bond wires 806 are shown in FIG. 8B that couple signal pins on IC die 102 to traces or bond fingers on substrate 700 along first edge 704. For example, a first bond wire 806a couples a signal pin on IC die 102 to a bond finger 122a on first protruding portion 712. A second bond wire 806b couples a signal pin on IC die 102 to a bond finger 122e on substrate 700 by crossing over second ground ring portion 114h. A third bond wire 806c couples a signal pin on IC die 102 to a bond finger 122b on second protruding portion 714. Because first and second protruding portions 712 and 714 extend over ground ring 114 towards IC die 102, first and third bond wires 806a and 806c are relatively shorter compared to second bond wire 806b.

As shown proximate to second edge 706 of substrate 700 in FIG. 8B, rectangular substrate hole 716 and round substrate hole 718 expose fourth and fifth ground ring portions 114j and 114k, respectively. A third ground bond wire 804c is coupled between a ground pin on IC die 102 and fourth ground ring portion 114j. A fourth ground bond wire 804d is coupled between a ground pin on IC die 102 and fifth ground ring portion 114k. Because fourth and fifth ground ring portions 114j and 114k are adjacent or proximate to second edge 706 and cavity 116, third and fourth ground bond wires 804c and 804d are relatively short. Furthermore, six bond wires 806 couple signal pins on IC die 102 to traces or bond fingers on substrate 700 along second edge 706. For example, a fourth bond wire 806d couples a signal pin on IC die 102 to a bond finger 122c on substrate 700. Because ground ring 114 is covered by substrate 700 along second edge 706 (except for fourth and fifth ground ring portions 114j and 114k), fourth bond wire 806d does not have to cross over ground ring 114, but can instead have a relatively shorter length to reach substrate 700.

As shown on third edge 708 of substrate 700 in FIG. 8B, recessed substrate portion 720 exposes a portion of ground ring 114, sixth ground ring portion 114*l*. The remainder of ground ring 114 is covered along third edge 708 by substrate 700. A fifth ground bond wire 804e is coupled from a ground pin on IC die 102 to sixth ground ring portion 114*l*. Because sixth ground ring portion 114*l* is adjacent to cavity 116, fifth ground bond wire 804e is relatively short. Furthermore, seven additional bond wires couple signal pins on IC die 102 to traces or bond fingers on substrate 700 adjacent to third edge 708. For example, a fifth bond wire 806e couples a signal pin on IC die 102 to a bond finger 122d on substrate 700. Because substrate 700 extends over ground ring 114 towards IC die 102 along third edge 708 (except for recessed substrate portion 720), fifth bond wire 806e is relatively short.

As shown on fourth edge 710 of substrate 700 in FIG. 8B, fourth edge 710 forms a substantially straight edge so that substrate 700 is substantially a uniform distance from IC die 102 along fourth edge 710. The portion of ground ring 114 along fourth edge 710 is covered by substrate 700. Eight bond wires couple signal pins on IC die 102 to traces or bond fingers on substrate 700 adjacent to fourth edge 710. For example, a sixth bond wire 806f couples a signal pin on IC die 102 to a bond finger 122e on substrate 700. Because substrate 700 extends over ground ring 114 towards IC die 102 along fourth edge 710, sixth bond wire 806f is relatively short. Ground (or power) pins on the side of IC die 102 adjacent to fourth edge 710 may be coupled to ground (or power) by other means than being coupled to ground ring 114. For example, they may be coupled to ground (or power) solder balls on substrate 700. For example, IC die pin 808 may be a ground pin. IC die ground pin 808 may be coupled by a ground bond wire 810 to a ground bond finger 812 on substrate 700 that is coupled to a ground solder ball. For example, solder ball 802 may be a ground solder ball. Ground solder ball 802 may be coupled to PCB ground when BGA package 800 is coupled to a PCB.

The embodiments provided above in this section are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 9:
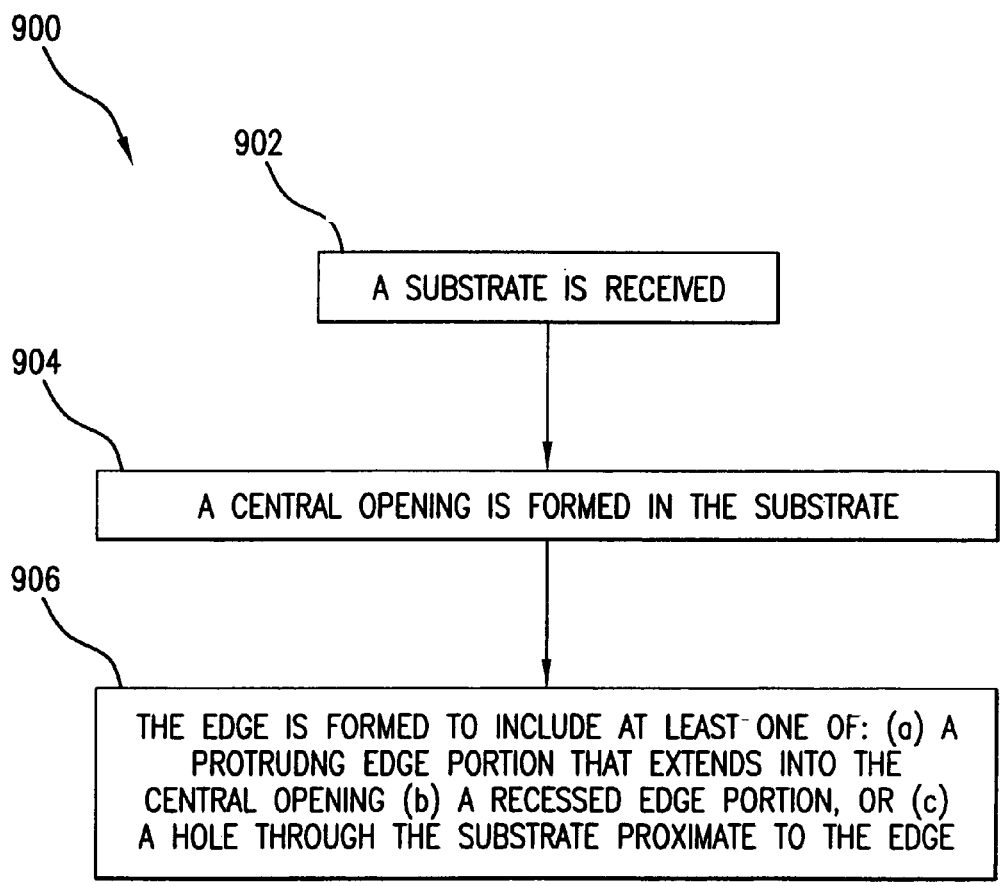
FIG. 9 shows a flowchart that provides steps for forming a substrate according to an exemplary embodiment of the present invention.

Forming Integrated Circuit Package Substrates
According to Embodiments of the Present Invention FIG. 9 shows a flowchart 900 providing operational steps for forming substrates for use in integrated circuit packages, according to embodiments of the present invention. The steps of FIG. 9 do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

Flowchart 900 begins with step 902. In step 902, a substrate is received. For example, a substrate such as substrate 700 shown in FIG. 7 may be received.

In step 904, a central opening is formed in the substrate. For example, the central opening is central opening 702 in substrate 700. The central opening has an edge. For example, the edge may be one of first, second, third, and fourth edges 704, 706, 708, and 710 of central opening 702.

In step 906, the edge is formed to include at least one of: (a) a protruding edge portion that extends into the central opening (b) a recessed edge portion, or (c) a hole through the substrate proximate to the edge. For example, in an embodiment according to feature (a) of step 906, first edge 704 shown in FIG. 7 is formed to include first and second protruding edge portions 712 and 714. As shown in FIGS. 8A and 8B, first and second protruding portions 712 and 714 extend over ground ring 114 towards IC die 102. In another example embodiment according to feature (b) of step 906, third edge 708 shown in FIG. 7 is formed to include recessed substrate portion 720. As shown on third edge 708 of substrate 700 in FIG. 8B, recessed substrate portion 720 exposes a portion of ground ring 114, sixth ground ring portion 114*l*. In another example embodiment according to feature (c) of step 906, second edge 706 shown in FIG. 7 is formed to include first and second substrate holes 716 and 718 proximate to second edge 706. As shown proximate to second edge 706 of substrate 700 in FIG. 8B, rectangular substrate hole 716 and round substrate hole 718 expose fourth and fifth ground ring portions 114j and 114k, respectively.

In an embodiment, step 904 includes the step where the central opening in the substrate is formed to be a substantially rectangular shape. For example, central opening 702 in substrate 700 is substantially rectangular as shown in FIG. 7. Alternatively, central opening 702 may be formed in other shapes, as described above.

In an embodiment, the IC package that will accommodate the substrate is a BGA package. Therefore, step 902 may include the step where a BGA package compatible substrate is received. In alternative embodiments, the substrate may be adapted for use in types of IC packages other than BGA packages.

In an embodiment, steps 904 and 906 may be performed in a single step. In other words, for example, central opening 702 and a modification to an edge of central opening 702, such as recessed substrate portion 720, may be simultaneously formed in substrate 700. The central opening and respective modifications described herein (e.g., including protruding portions, recessed portions, and substrate holes) may be formed together at the time the substrate is created, or alternatively may be formed in steps at one or more later times. In an embodiment, the central opening and respective modifications may be cut or punched out of a substrate. The central opening and modifications may be cut or punched from the substrate in a single cutting or punching action, or may be cut or punched into the substrate individually. For example, one or more of central opening 702, first and second protruding edge portions 712 and 714, recessed substrate portion 720, and first and second substrate holes 716 and 718, may be formed in substrate 700 in a single punching action, or may be individually formed in substrate 700. For instance, central opening 702 could first be punched into substrate 700. Subsequently, recessed substrate portion 720 and/or first substrate hole 716 could be later punched into substrate 700. The central opening and respective modifications thereto may be formed into substrate 700 in any order and in any number of steps.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of forming an enhanced substrate for an integrated circuit (IC) package, comprising:
   forming a central opening in a first surface of a substrate;
   wherein forming the central opening includes forming a protruding edge portion that extends from an edge of the central opening into the central opening.

2. The method of claim 1, wherein forming the protruding edge portion includes forming the protruding edge portion to extend across a portion of a central ground ring of a stiffener.

3. The method of claim 1, wherein forming the central opening includes forming a substantially rectangular opening.

4. The method of claim 1, wherein forming the enhanced substrate includes forming the enhanced substrate for a ball grid array package.

5. The method of claim 1, wherein forming the protruding edge portion includes forming a tab-shaped protruding edge portion.

6. The method of claim 1, wherein forming the protruding edge portion includes forming a trace that extends into the protruding edge portion.

7. The method of claim 6, wherein forming the protruding edge portion includes configuring the protruding edge portion to allow a wire to couple an IC die to said trace.

8. A method of forming an enhanced substrate for an integrated circuit (IC) package, comprising:
   forming a central opening in a first surface of a substrate;
   wherein forming the central opening includes forming a recessed edge portion that extends from the first surface to a second surface of the substrate that opposes the first surface in an edge of the central opening.

9. The method of claim 8, wherein forming the recessed edge portion includes forming the recessed edge portion to expose a portion of a central ground ring of a stiffener.

10. The method of claim 9, wherein forming the recessed edge portion includes configuring the recessed edge portion to allow a bond wire to couple an IC die to the exposed portion of the central ground ring.

11. A method of forming an enhanced substrate for an integrated circuit (IC) package, comprising:
    forming a central opening in a first surface of a substrate;
    wherein forming the central opening includes forming a recessed edge portion in an edge of the central opening
    wherein forming the central opening includes forming a substantially rectangular opening.

12. A method of forming an enhanced substrate for an integrated circuit (IC) package, comprising:
    forming a central opening in a first surface of a substrate;
    wherein forming the central opening includes forming a recessed edge portion in an edge of the central opening
    wherein forming the enhanced substrate includes forming the enhanced substrate for a ball grid array package.

13. A method of forming an enhanced substrate for an integrated circuit (IC) package, comprising:
    forming a central opening in a first surface of a substrate; and
    forming a hole proximate to an edge of the central opening;
    wherein forming the hole includes forming the hole to expose a portion of a central ground ring of a stiffener.

14. The method of claim 13, wherein forming the hole includes configuring the hole to allow a bond wire to couple an IC die to the exposed portion of the central ground ring.

15. The method of claim 13, wherein forming the central opening includes forming a substantially rectangular central opening.

16. A method of forming an enhanced substrate for an integrated circuit (IC) package, comprising:
    forming a central opening in a first surface of a substrate; and
    forming a hole proximate to an edge of the central opening;
    wherein forming the enhanced substrate includes forming the enhanced substrate for a ball grid array package.

17. A method of forming an enhanced substrate for an integrated circuit (IC) package, comprising:
    forming a central opening in a surface of a substrate; and
    configuring an edge of the central opening to cover a portion of a central ground ring of a stiffener when the substrate is coupled to the surface of the stiffener;
    wherein forming the central opening includes forming the central opening in the surface so that a trace is proximate to the edge of the central opening.

18. The method of claim 17, further comprising configuring the edge to allow a wire to couple an IC die to the trace.

19. The method of claim 17, wherein forming the central opening includes forming a substantially rectangular opening.

20. The method of claim 17, wherein forming the enhanced substrate includes forming the enhanced substrate for a ball grid array package.

* * * * *